United States Patent
Trivedi

(10) Patent No.: US 7,919,382 B2
(45) Date of Patent: Apr. 5, 2011

(54) METHODS FOR FORMING VARACTOR DIODES

(75) Inventor: Vishal P. Trivedi, Chandler, AZ (US)

(73) Assignee: Freescale Semicondcutor, Inc., Austin, TX (US)

( * ) Notice: Subject to any disclaimer, the term of this patent is extended or adjusted under 35 U.S.C. 154(b) by 298 days.

(21) Appl. No.: 12/207,120

(22) Filed: Sep. 9, 2008

(65) Prior Publication Data

US 2010/0059859 A1 Mar. 11, 2010

(51) Int. Cl.
*H01L 21/20* (2006.01)

(52) U.S. Cl. .................. 438/379; 257/E21.364

(58) Field of Classification Search .................. 438/379, 438/919; 257/E21.364
See application file for complete search history.

(56) References Cited

U.S. PATENT DOCUMENTS

| 4,106,953 | A | 8/1978 | Onodera |
| 4,827,319 | A | 5/1989 | Pavlidis et al. |
| 5,557,140 | A | 9/1996 | Nguyen et al. |
| 5,747,865 | A * | 5/1998 | Kim et al. ..................... 257/480 |
| 6,559,024 | B1 | 5/2003 | Boles et al. |
| 6,825,546 | B1 * | 11/2004 | Walker et al. ................. 257/596 |
| 7,135,375 | B2 | 11/2006 | Coolbaugh et al. |

* cited by examiner

*Primary Examiner* — Chandra Chaudhari
(74) *Attorney, Agent, or Firm* — Ingrassia Fisher & Lorenz, P.C.

(57) ABSTRACT

An improved varactor diode (40) is obtained by providing a substrate (70) having a first surface (73) and in which are formed a first N region (46) having a first peak dopant concentration (47) located at a first depth (48) beneath the surface (73), and a first P region 49having a second peak dopant concentration (50) greater than the first peak dopant concentration located at a second depth (51) beneath the surface less than the first depth (48), and a second P region (42) having a third peak dopant concentration (43) greater than the second peak dopant concentration and located at a third depth at or beneath the surface (73) less than the second depth (51), so that the first P region (49) provides a retrograde doping profile whose impurity concentration increases with distance from the inward edge (44) of the second P region (42) up to the second peak dopant concentration (50).

11 Claims, 5 Drawing Sheets ns for Varactor

METHODS FOR FORMING VARACTOR DIODES

FIELD OF THE INVENTION

The present invention generally relates to semiconductor (SC) devices and integrated circuits (ICs) and, more particularly, structures and methods for variable capacitance semiconductor devices referred to as "varactors".

BACKGROUND OF THE INVENTION

Varactor diodes are rectifying devices, typically PN junction devices, whose capacitance varies as a function of the applied reverse voltage. The change in varactor capacitance with applied voltage comes about because the depletion region of the reverse biased junction widens and narrows as the applied voltage is changed. This change in capacitance with applied voltage can be used to advantage to provide tuning and other functions where a voltage variable capacitance is useful. Varactor diodes are much used for this purpose.

However the usefulness of varactors depends upon a number of factors such as the breakdown voltage, the tuning ratio and the series resistance. If a sufficiently large reverse voltage is applied, the varactor will breakdown or fail in generally the same manner as any diode. Obviously the maximum tuning voltage that can be applied is limited by the breakdown voltage. Hence, the breakdown voltage needs to be higher than the operating voltage. The tuning ratio ($TR=C_{jv=0}/C_{jv=V}$) is defined as the ratio of the capacitance $C_{jv}$ at one voltage, e.g., v=0 volts, to the capacitance at another voltage, e.g., v=V volts, and is a measure of the amount of capacitance variation that can be usefully obtained. For example, the higher the tuning ratio, the greater the tuning range of an oscillator where the varactor diode capacitance $C_{jv}$ is controlling the oscillator frequency. So, it is desirable that the tuning ratio (TR) be large. Further, even though the varactor is DC reverse biased and little or no significant DC current flows, it is still carrying AC current so the series resistance contributes to AC losses. Hence, the series resistance of the varactor diode is important since it affects the quality factor (Q) of the varactor as a tuning element. The higher the series resistance, the lower the Q.

It is usually the case with present day varactors that changing the device design or construction to improve one or more of the breakdown voltage, tuning ratio, or series resistance can adversely affect the others. Thus, a need continues to exist for improved varactor structures and methods wherein one or more of these factors, e.g., the tuning ratio, can be improved without significant adverse effect on the other varactor properties.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
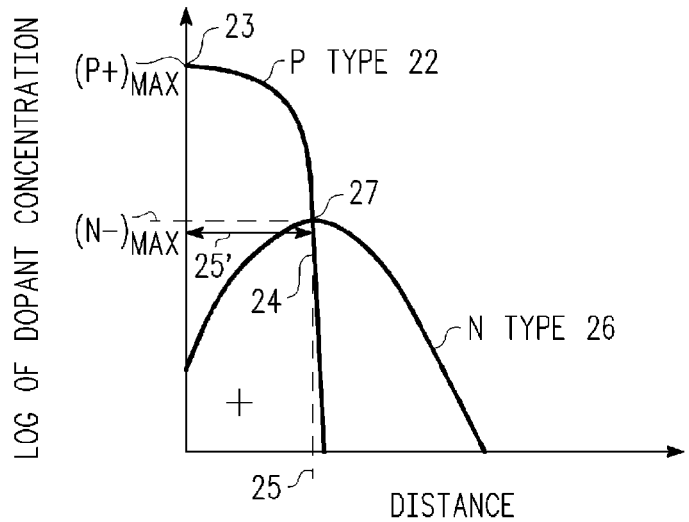
FIGS. 1-3 are simplified schematic illustrations of doping concentration versus depth for varactor diodes employing hyper-abrupt junctions according to the prior art and under different conditions of bias.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and including type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting semiconductor-on-insulator (SOI) structures, and combinations thereof. The term "semiconductor" is abbreviated as "SC."

For convenience of explanation and not intended to be limiting, the semiconductor devices and methods of fabrication are described herein for silicon semiconductors but persons of skill in the art will understand that other semiconductor materials can also be used. Further, even though the present invention is illustrated for the case of a PN junction varactor diode, those of skill in the art will understand that the present invention applies to any type of rectifying device providing a voltage variable capacitance and whose depletion width depends upon the doping of the semiconductor and the applied voltage. Non limiting examples are PN junction diodes, metal-semiconductor diodes and hetero-junction diodes. As used herein the term "metal" is intended to include semi-metals, semiconductor-metal alloys and other materials that are relatively more conductive than the associated semiconductor body.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second, opposite conductivity type", where the first conductivity type may be either N or P type and the second opposite conductivity type is then either P or N type, and so forth.

Figure 2:
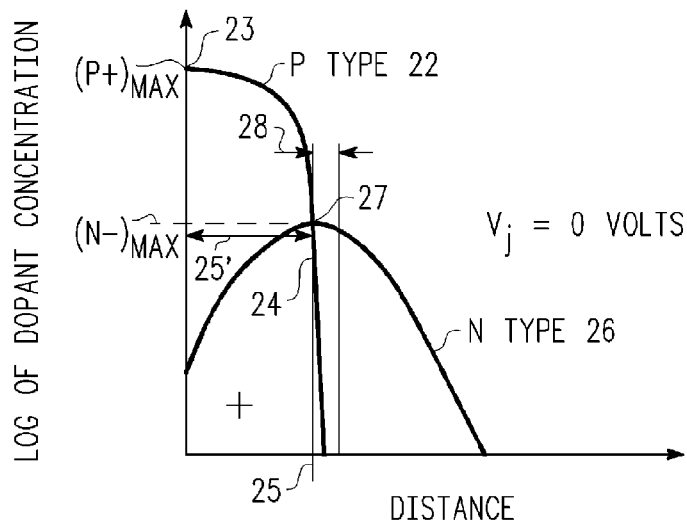
Figure 3:
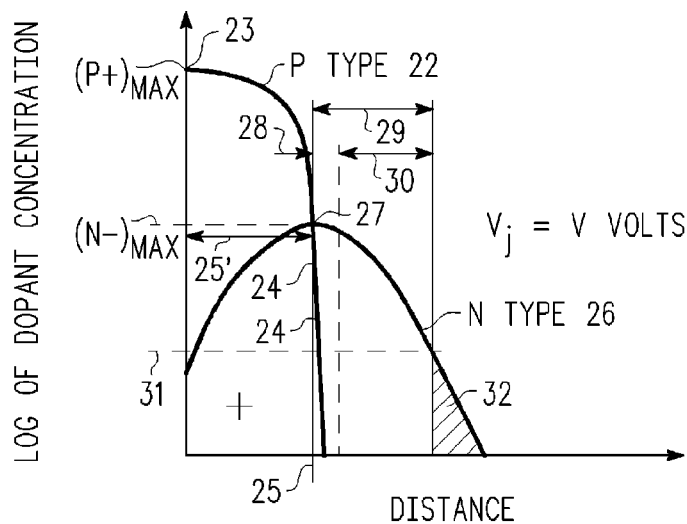

FIGS. 1-3 are simplified schematic illustrations of the doping concentration versus depth for varactor diodes 20 employing hyper-abrupt PN junctions according to the prior art and under different conditions of bias. The ordinate is the impurity dopant concentration (generally on a log scale) and the abscissa is the distance from the diode surface (generally on a linear scale). For convenience of explanation, it is assumed that the varactor diode is a P+N− hyper-abrupt diode, that is, with P type region 22 heavily doped, for example with P+ maximum concentration $(P+)_{MAX}$ 23 at depth=0 and rapidly falling concentration profile portion or edge 24. N− type region 26 is more moderately doped with peak concentration $(N-)_{MAX}$ 27 usually several orders of magnitude less than P+ maximum doping concentration $(P+)_{MAX}$ 23, and having $(N-)_{MAX}$ 27 located approximately at depth 25. The N-type doping has a steep (hyper-abrupt) dopant gradient, with dopant concentration decreasing as one moves away from the PN junction located at depth 25. Compared to a constant N-type doping concentration, such hyper-abrupt N-type doping increases the voltage dependence of the junction capacitance according to the prior art. FIG. 2 illustrates depletion width 28 at zero junction bias (i.e., Vj=0 volts), and FIG. 3 illustrates depletion width 29 at, for example, Vj=V volts. Increase 30 in junction width 29 takes place substantially within more lightly doped N− type region 26. The tuning ratio TR is given by $TR_V=(C_{jv=0})/C_{jv=V})$, where the subscript "V" on the tuning ratio $(TR_V)$ indicates the voltage at which the voltage dependent junction capacitance $C_{jv}$ was measured relative to the junction capacitance at Vj=0 volts.

The breakdown voltage of varactor diode 20 is determined largely by peak concentration $(N-)_{MAX}$ 27 and the Q of varactor diode 20 is influenced by N side dopant concentration 31 in region 32 beyond depletion region width 29. If dopant concentration 31 is increased in order to reduce the series resistance and increase the Q of diode 20, then depletion width 29 becomes smaller and the tuning ratio is lower, which is undesirable. If peak concentration $(N-)_{MAX}$ 27 is reduced in order to increase the breakdown voltage, a similar result can occur, undesirably yielding decreased Q. A need continues to exist for varactor diode structures and methods wherein, for example, the tuning ratio can be improved without significant adverse impact on the breakdown voltage and/or the Q of the varactor diode.

Figure 4:
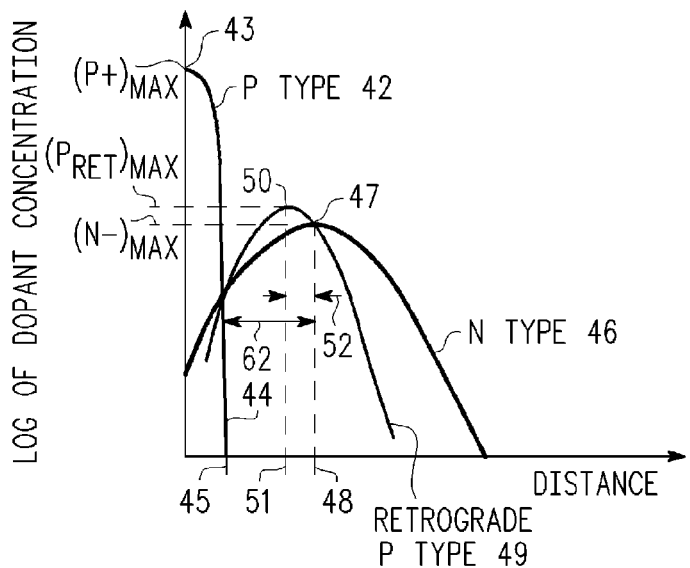
FIGS. 4-6 are simplified schematic illustrations of the doping concentration versus depth for varactor diodes according to the present invention and under different conditions of bias.
Figure 5:
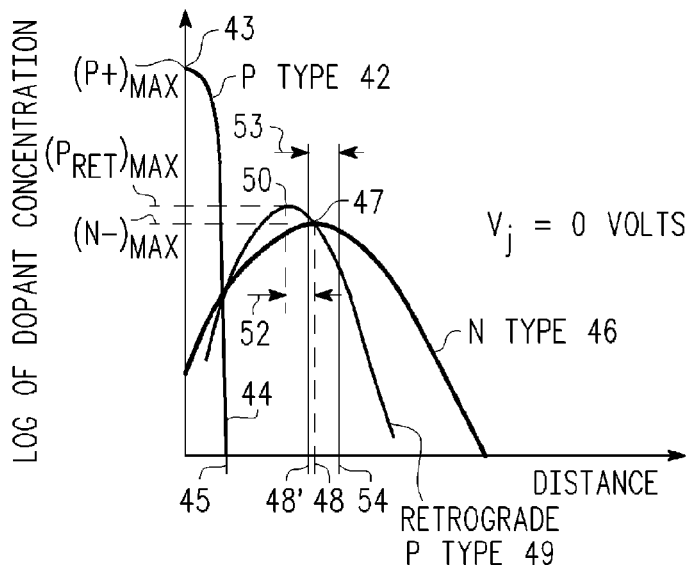
Figure 6:
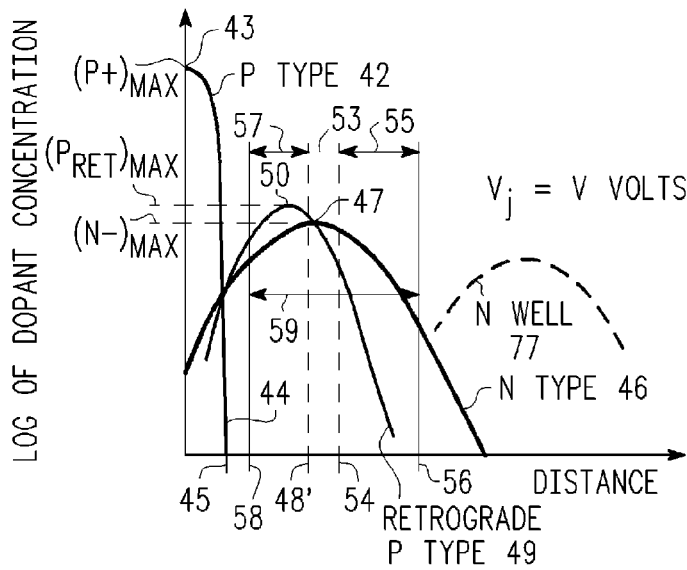

FIGS. 4-6 are simplified schematic illustrations of doping concentration versus depth for varactor diodes 40 according to the present invention and under different conditions of bias. The abscissa and ordinate of FIGS. 4-6 are analogous to those in FIGS. 1-3. P type region 42 with steeply falling region or edge 44 is analogous in function to P type region 22 with steeply falling region or edge 24, and N type region 46 is analogous in function to N type region 26, however their relative spacing is different and additional doping is included. For example, depth 48 of $(N-)_{MAX}$ 47 of N− type region 46 is no longer approximately coincident with depth 45 of region or edge 44 of P+ region 42, but is spaced apart therefrom approximately by distance 62. Also, retrograde P type region 49 having peak concentration $(P_{RET})_{MAX}$ 50 at location (depth) 51 is introduced between N type region 46 and P+ region 42, where $(P_{RET})_{MAX}$ 50 and $(N-)_{MAX}$ 47 are desirably separated by distance 52. The term "retrograde" is used to describe P type region 49 because, unlike P type region 42, as one proceeds deeper into device 40, the dopant concentration of P type region 49 is increasing until peak concentration $(P_{RET})_{MAX}$ 50 is reached at depth 51. In general, it is desirable that $(P_{RET})_{MAX}$ 50 is greater than $(N-)_{MAX}$ 47, usefully by a factor of about 10 or less, more conveniently by a factor of about 4 or less and preferably by a factor of about 2 or less, but larger or smaller values can also be used. Also, depth 51 of $(P_{RET})_{MAX}$ 50 is desirably less than depth 48 of $(N-)_{MAX}$ 47, and (measured from edge 44 about where the profiles 42, 46 intersect) usefully about 40 to 50 percent of separation or distance 62, more conveniently about 30 to 40 percent of separation or distance 62 and preferably about 25 percent of separation or distance 62. Stated another way, separation 52 of depth 51 of $(P_{RET})_{MAX}$ 50 from depth 48 of $(N-)_{MAX}$ 47 is usefully about 60 to 50 percent of separation or distance 62, more conveniently by about 70 to 60 percent of separation or distance 62 and preferably about 75 percent of separation or distance 62.

FIG. 5 illustrates depletion width 53 at zero junction bias (i.e., Vj=0 volts), and FIG. 6 illustrates depletion width 59 at, for example, Vj=V volts. At zero applied volts, depletion width 53 extending from depth 48' to depth 54 is located primarily in more lightly doped N type region 46, and depth 48' is little different than depth 48 of $(N-)_{MAX}$ 47. However, as reverse voltage is applied to device 40 as shown in FIG. 6, increase 55, 57 in junction width from width 53 at Vj=0 volts to width 59 at Vj=V volts takes place within N− type region 46 by amount 55 and within retrograde P type region 49 by amount 57, thereby providing total depletion region width 59 at Vj=V volts. Since depletion width 59 of FIG. 6 is substantially larger than depletion width 29 of FIG. 3, smaller values of capacitance $C_{jv}$ can therefore be obtained with the arrangement of FIGS. 4-6 and the tuning ratio given by $TR_V=(C_{jv=0})/C_{jv=V})$ is larger. This is very desirable.

Figure 13:
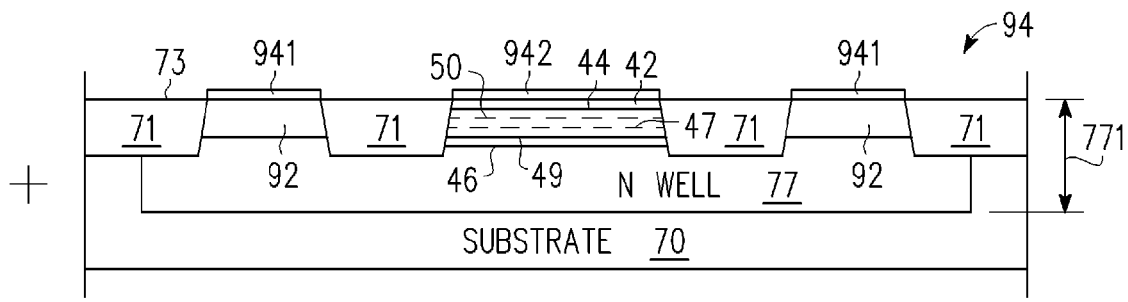

A further advantage of the invented arrangement is that, other things being equal, device 40 of FIGS. 4-6 exhibits higher breakdown voltage values than are obtained from prior art device 20 of FIGS. 1-3. This is because the applied voltage is distributed over larger depletion region width 59, so that the critical breakdown electric field is not reached until higher voltages are applied. Further, the arrangement of device 40 of FIGS. 4-6 does not significantly affect the series resistance compared to device 20 of FIGS. 1-3. While thickness 62 (see FIG. 4) of retrograde region 49 between $(N-)_{MAX}$ 47 and edge 44 of P+ region 22 is introduced in device 40, its series resistance effect is negligible compared to the series resistance contributed by other parts of the varactor device. This is illustrated more clearly in connection with FIG. 13 where the series resistance is dominated by the current path through N well region 77 to contacts 92, 94I. Thus, the arrangement of device 40 provides improved tuning ratio and breakdown voltage without a significant adverse impact on the Q of the varactor device. This is highly desirable. The series resistance contributed by the remainder of the varactor device beyond N type region 46 may be reduced by providing a further N type region (e.g., N well region 77) having an impurity concentration at least equal to that of region 46 at the maximum extent of depletion region width 59 and higher impurity concentrations beyond width 59. This is accomplished in device 40 of FIGS. 6 and 13 by N well 77.

FIGS. 7-13 are simplified cross-sectional views of varactor diode 40 of the type illustrated in FIGS. 4-6 at different stages 101-107 of manufacture according to embodiments of the present invention. In connection with FIGS. 7-13, various implants are referred to as the preferred doping method. However, other doping means well known in the art may also be used. When doping is by ion implantation, it is conventional to provide a screen oxide or other dielectric on surface 73 to minimize surface damage, but in other embodiments, it may be omitted. Such screen oxide is not shown in FIGS. 7-13 to avoid cluttering the drawings and obscuring the invention. Also, the masks used in connection with such ion implantation can be photoresist or various hard mask materials (e.g., nitrides, oxides, mixtures thereof) or combinations thereof. Unless otherwise noted, use of photoresist masks is preferred.

Figure 7:
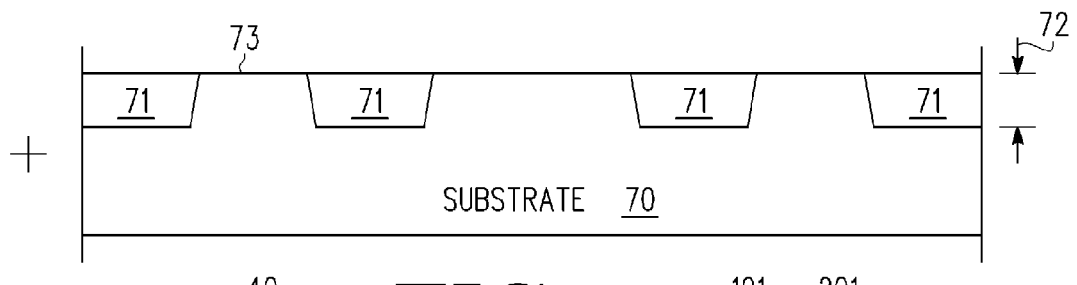
FIGS. 7-13 are simplified cross-sectional views of a varactor diode of the type illustrated in FIGS. 4-6 at different stages of manufacture according to embodiments of the present invention.
Figure 8:
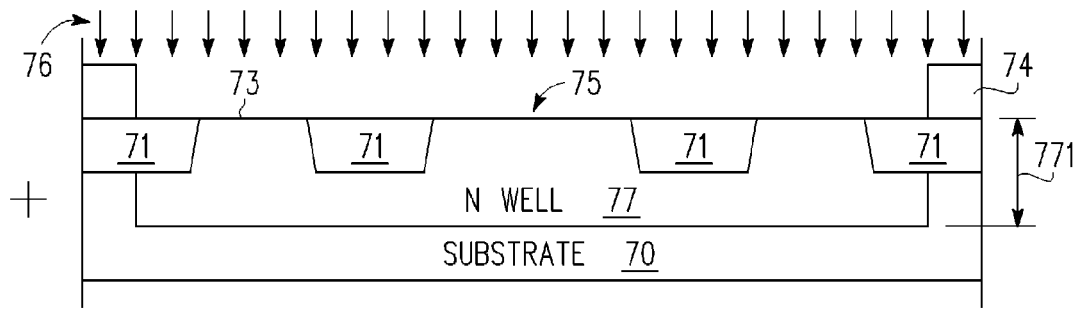
Figure 9:
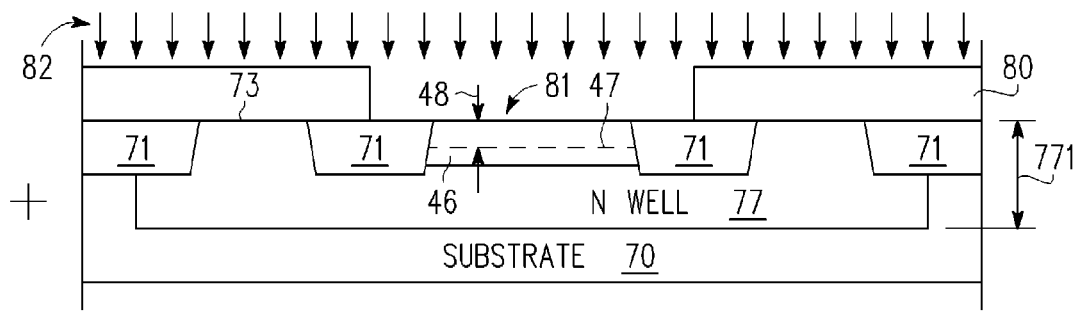

Referring now to manufacturing stage 101 of FIG. 7, substrate 70 is provided having surface 73 in which dielectric isolation regions 71 of depth 72 are provided, using means well known in the art. Dielectric isolation regions 71 are desirable, but may be omitted in other embodiments. Semiconductor substrate 70 is conveniently of P type silicon with a sheet resistance in the range of 10 to 1000 Ohm-cm, but, as noted earlier, may be of any type of semiconductor and of higher or lower resistivity or sheet resistance. Structure 201 results from manufacturing stage 101. Referring now to manufacturing stage 102 of FIG. 8, mask 74 with opening 75 is provided on surface 73. In a preferred embodiment, N type implant 76 is used to form N well 77 of depth 771 from surface 73, but in other embodiments, other doping means well known in the art may also be used. Implant 76 of, e.g., phosphorous, conveniently has energy in the range of about 600 to 1000 KeV and a dose in the range of about 5E13 to 10E13 cm$^{-2}$, but higher and lower energies may be used depending upon the desired depth of penetration of N well 77 and higher or lower doses may be used depending upon the desired varactor properties and the tolerable series resistance. Structure 202 results. Referring now to manufacturing stage 103 of FIG. 9, mask 74 is removed and replaced with mask 80 having opening 81. In a preferred embodiment, implant 82 is used to form N type region 46 of FIGS. 4-6, with peak concentration 47 located at depth 48 below surface 73. Implant 82 of, e.g., arsenic, conveniently has energy in the range of about 300 to 450 KeV and dose in the range of about 3E13 to 5E13 cm$^{-2}$, but higher and lower energies may be used depending upon the desired depth of penetration of N type region 46 and higher or lower doses may be used depending upon the desired varactor properties. Structure 203 results.

Figure 10:
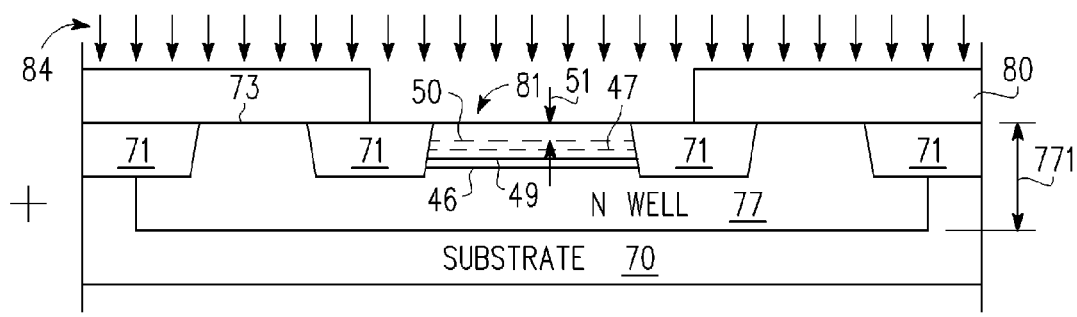
Figure 11:
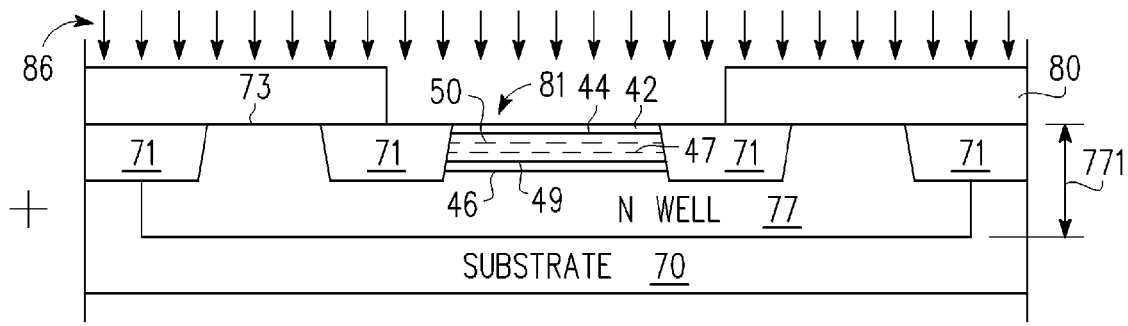

Referring now to manufacturing stage 104 of FIG. 10, mask 80 is retained or in other embodiments, removed and replaced, still having opening 81. In a preferred embodiment, implant 84 is used to form P type region 49 of FIGS. 4-6, with peak concentration 50 located at depth 51 below surface 73. Implant 84 of, e.g., boron diflouride, conveniently has energy in the range of about 150 to 250 KeV and a dose in the range of about 7E13 to 1E14 cm$^{-2}$, but higher and lower energies may be used depending upon the desired depth of penetration of P type region 49 and higher or lower doses may be used depending upon the desired varactor properties. In general, depth 51 should be less than depth 48 and peak concentration 50 should be greater than peak concentration 47. Structure 204 results. Referring now to manufacturing stage 105 of FIG. 11, mask 80 is retained or, in other embodiments, removed and replaced, still having opening 81. In a preferred embodiment, implant 86 is used to form P type region 42 of FIGS. 4-6, with peak concentration 43 (see FIGS. 3-6) located at or just below surface 73. Implant 86 of, e.g., boron, conveniently has energy in the range of about 3 to 7 KeV, preferably about 5 KeV, and a dose conveniently in the range of about 1E14 to 4E14 cm$^{-2}$, preferably about 2E14 cm$^{-2}$, but higher and lower energies may be used depending upon the desired depth of penetration of P type region 42 and higher or lower doses may be used depending upon the desired varactor properties. In general, rapidly falling edge 44 of implant 86 should be shallower than depth 51 of P type region 49. Structure 205 results. Alternatively, the P type region 42 can be formed using selective epitaxial growth according to any known art.

Figure 12:
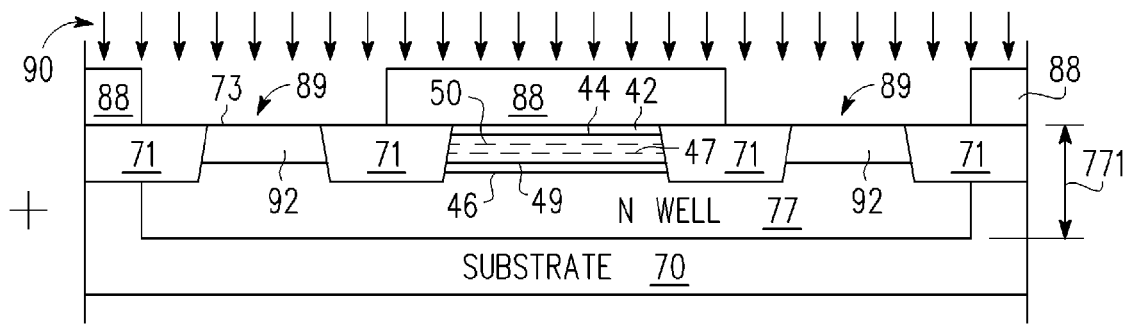

Referring now to manufacturing stage 106 of FIG. 12, mask 80 is removed and replaced by mask 88 having openings 89. While two openings 89 are shown in FIG. 12 and this is preferred for device symmetry, any number of openings may be used. In a preferred embodiment, implant 90 is used to form N type contact regions 92 to N well 77. Implant 90 of, e.g., arsenic, conveniently has energy in the range of about 10 to 30 KeV, preferably about 20 KeV, and a dose in the range of about 1E15 to 10E15 cm$^{-2}$, preferably about 4E15 to 6E15 cm$^{-2}$, but higher and lower energies may be used depending upon the desired depth of penetration of N type contact regions 92 and higher or lower doses may be used depending upon the doping of N well 77. Structure 206 results. Referring now to manufacturing stage 107 of FIG. 13, mask 88 is desirably removed and silicide electrodes 941, 942 (collectively 94) provided, respectively, on N+ contact regions 92 and P+ region 42. Any known method of silicide formation may be used and for silicon semiconductor, silicides such as for example and not intended to be limiting TiSi$_2$, CoSi$_2$, NiSi$_2$ and others are suitable. CoSi$_2$ is preferred and may be formed, for example, by sputtering 8 to 15 nano-meters of cobalt on surface 73 in argon at about 7 milli-Torr at about 150 degrees Celsius. The sputtered Co layer is annealed at about 450 degrees Celsius for about 60 seconds and then any unreacted Co is removed by blanket etching and the structure further annealed at about 850 degrees Celsius for an additional 60 seconds, but other temperatures, times, metals and etchants may also be used. Structure 207 results wherein, other than for external interconnections, varactor 40 is completed.

Figure 14:
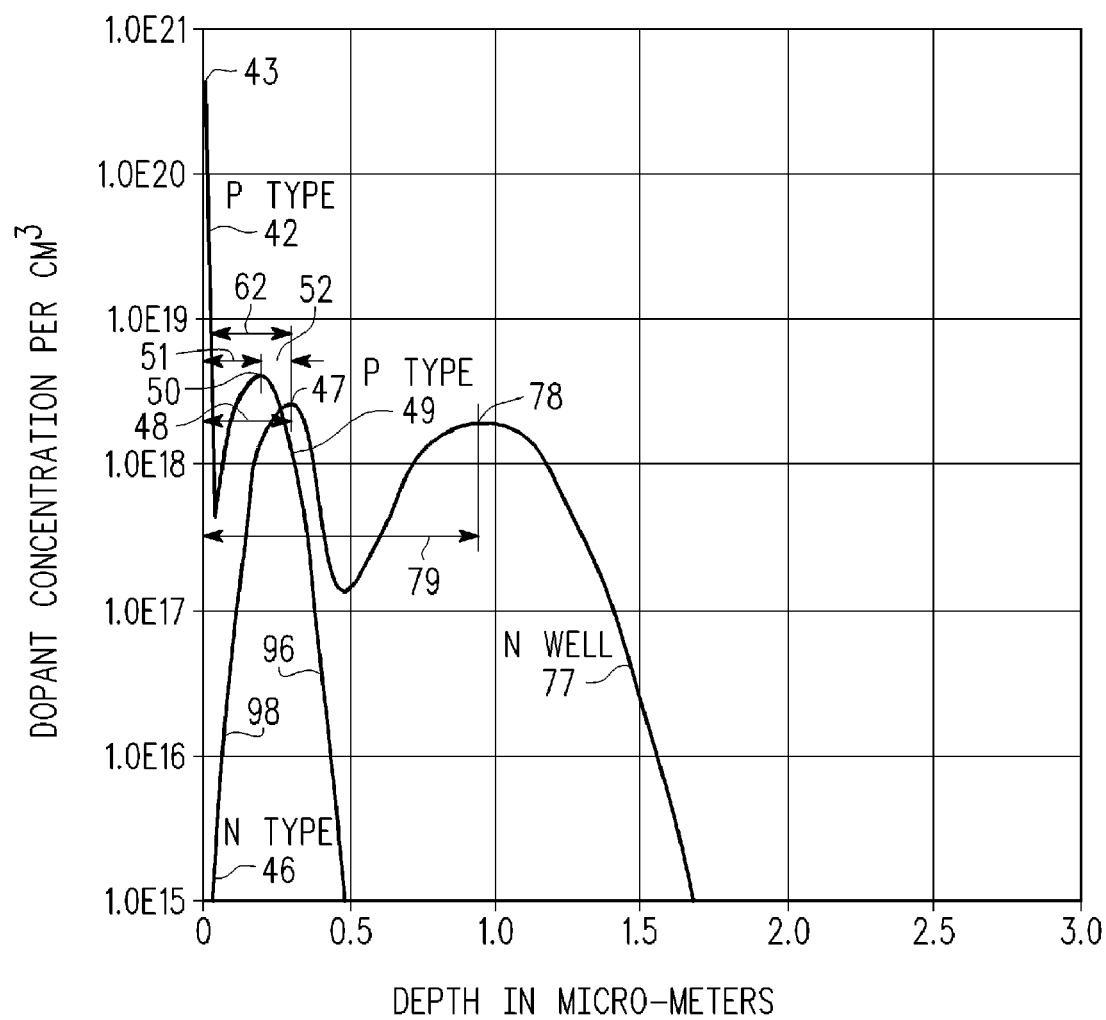
FIG. 14 is a simplified schematic plot of doping concentration versus depth of an illustrative varactor diode processed according to FIGS. 7-13.

FIG. 14 is a simplified schematic plot of doping concentration versus depth of an illustrative varactor diode processed according to manufacturing stages 101-107 of FIGS. 7-13. Trace 96 illustrates the P-type doping profile resulting from the combination of P+ region 42 and retrograde P region 49. Trace 98 illustrates the N-type doping profile resulting from the combination of N type region 46 and N well 77. N well 77 desirably has peak concentration 78 located at depth 79 beneath surface 73. As noted in connection with FIG. 6, it is desirable that the doping profile of N well 77 be such that it not exceed the doping profile of N region 46 within depletion region width 59 at the maximum operating voltage. While, the various depths 48, 51, etc., shown in FIGS. 4-13 are described as being measured with respect to surface 73, this is merely for convenience of illustration. It is the relative depth from edge 44 of P+ region 42 that is of interest and depths 48, 51, 79 may equally well be measured from edge 44 (see FIGS. 4-6) by subtracting depth 45 of P+ region 42 from depths 48, 51, 79, etc. Accordingly, references to the depth of various peak concentrations herein and in the claims may be considered to refer to the distance measured from edge 44 of P+ region 42 in the vicinity of where profiles 42 and 46 intersect.

According to a first embodiment, there is provided a varactor diode (40), comprising, a substrate (70) having a first surface (73), a first region (46) of a first conductivity type having a first peak dopant concentration (47) located at a first depth (48) beneath the surface (73), a second region (49) of a second, opposite, conductivity type, having a second peak dopant concentration (50) greater than the first peak dopant concentration (47) located at a second depth (51) beneath the surface (73), and a third region (42) of the second, opposite, conductivity type having a third peak dopant concentration (43) greater than the second peak dopant concentration and located at a third depth at or beneath the surface (73) less than the second depth (51), so that the second region (49) of the second, opposite, conductivity type provides a retrograde doping profile. According to a further embodiment, the second peak dopant concentration (50) exceeds the first peak dopant concentration (47) by a factor of about 10. According to a still further embodiment, the second peak dopant concentration (50) exceeds the first peak dopant concentration (47) by a factor of about 4. According to a yet further embodiment, the second peak dopant concentration (50) exceeds the first peak dopant concentration (47) by a factor of about 2. According to a still yet further embodiment, the second depth (51) is less than the first depth (48). According to a yet still further embodiment, the third depth (48) differs from a depth where the first and third regions have substantially the same doping concentration by a first amount (62). According to another embodiment, the second depth (51) is less than the first depth (48) by about 60 to 50 percent of the first amount (62). According to a still another embodiment, the second depth (51) is less than the first depth (48) by about 70 to 60 percent of the first amount (62). According to a yet another embodiment, the second depth (51) is less than the first depth (48) by about 75 percent of the first amount (62).

According to a second embodiment, there is provided a method for forming a varactor diode, comprising, providing a semiconductor substrate (70) having an outer surface (73), then in any order: forming a first doped region (46) of a first conductivity type beneath the surface, having a first peak dopant concentration (47) located a first distance (48) beneath the surface (73), forming a second doped region (49) of a second, opposite, conductivity type beneath the surface (73), having a second peak dopant concentration (50) located a second distance (51) beneath the surface (73), and forming a third doped region (42) of the second, opposite, conductivity type at or beneath the surface (73), having a third peak dopant concentration (43) such that the second doped (49) region forms a retrograde doping profile extending away from the third doped region (42) at least partly toward the first doped region (46). According to a further embodiment, the method further comprises, forming a fourth doped region (77) of the first conductivity type having a fourth peak doping concentration (78) located a fourth distance (79) beneath the surface (73). According to a still further embodiment, the fourth distance (79) exceeds the first distance (48). According to a yet further embodiment, the second distance (51) is less than the first distance (48). According to a still yet further embodiment, the second peak concentration (50) exceeds the first peak concentration (47). According to a yet still further embodiment, the second peak concentration (50) exceeds the first peak concentration (47) by a factor of about 10 or less. According to another embodiment, the second peak concentration (50) exceeds the first peak concentration (47) by a factor of about 4 or less. According to a still another embodiment, the third doped region (42) is formed by selective epitaxial growth.

According to a third embodiment, there is provided a method for forming a varactor comprising, providing a substrate (70) having an outer surface (73), then in any order: forming a first N-type doped region (77) in the substrate (70) having a first peak doping concentration (78) located a first distance (79) beneath the surface (73), forming a second N-type doped region (46) in the substrate (70) having a second peak dopant concentration (47) located a second distance (48) beneath the surface (73) less than the first distance (79), forming a third P-type doped region (49) in the substrate (70) having a third peak dopant concentration (50) located a third distance (51) beneath the surface (73) less than the second distance (48), and forming a fourth P-type doped region (42) having a fourth peak dopant concentration (43) greater than the third peak dopant concentration (50) and closer to the surface (73) than the third distance (51). According to a further embodiment, the fourth P-type doped region (42) is formed by selective epitaxial growth. According to a still further embodiment, the fourth peak dopant concentration (43) is greater than the third peak dopant concentration (50), and wherein the third peak dopant concentration (50) is greater than the second peak dopant concentration (47).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a varactor diode, comprising:
   providing a semiconductor substrate having an outer surface, then in any order:
   forming a first doped region of a first conductivity type beneath the surface, having a first peak dopant concentration located a first distance beneath the surface;
   forming a second doped region of a second, opposite, conductivity type beneath the surface, having a second peak dopant concentration located a second distance beneath the surface; and
   forming a third doped region of the second, opposite, conductivity type at or beneath the surface, having a third peak dopant concentration such that the second doped region forms a retrograde doping profile extending away from the third doped region at least partly toward the first doped region.

2. The method of claim 1, further comprising, forming a fourth doped region of the first conductivity type having a fourth peak doping concentration located a fourth distance beneath the surface.

3. The method of claim 2 wherein the fourth distance exceeds the first distance.

4. The method of claim 1, wherein the second distance is less than the first distance.

5. The method of claim 1, wherein the second peak concentration exceeds the first peak concentration.

6. The method of claim 5, wherein the second peak concentration exceeds the first peak concentration by a factor of about 10 or less.

7. The method of claim 5, wherein the second peak concentration exceeds the first peak concentration by a factor of about 4 or less.

8. The method of claim 1, wherein the third doped region is formed by selective epitaxial growth.

9. A method for forming a varactor diode, comprising:
providing a substrate having an outer surface, then in any order:
forming a first N-type doped region in the substrate having a first peak doping concentration located a first distance beneath the surface;
forming a second N-type doped region in the substrate having a second peak dopant concentration located a second distance beneath the surface less than the first distance;
forming a third P-type doped region in the substrate having a third peak dopant concentration located a third distance beneath the surface less than the second distance; and
forming a fourth P-type doped region having a fourth peak dopant concentration greater than the third peak dopant concentration and closer to the surface than the third distance.

10. The method of claim 9, wherein the fourth P-type doped region is formed by selective epitaxial growth.

11. The method of claim 9, wherein the fourth peak dopant concentration is greater than the third peak dopant concentration, and wherein the third peak dopant concentration is greater than the second peak dopant concentration.

* * * * *